US009285507B2

United States Patent
Ko et al.

(10) Patent No.: US 9,285,507 B2
(45) Date of Patent: Mar. 15, 2016

(54) HIGH-REFRACTIVE COMPOSITION

(71) Applicant: LG CHEM, LTD., Seoul (KR)

(72) Inventors: Min Jin Ko, Daejeon (KR); Jae Ho Jung, Daejeon (KR); Dae Ho Kang, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 14/109,232

(22) Filed: Dec. 17, 2013

(65) Prior Publication Data
US 2014/0179869 A1 Jun. 26, 2014

Related U.S. Application Data

(63) Continuation of application No. PCT/KR2012/004819, filed on Jun. 18, 2012.

(30) Foreign Application Priority Data

Jun. 17, 2011 (KR) ........................ 10-2011-0059097

(51) Int. Cl.
C08G 77/00 (2006.01)
G02B 1/04 (2006.01)
C08L 83/04 (2006.01)
C08K 5/00 (2006.01)
C08K 5/56 (2006.01)
H01L 33/56 (2010.01)

(52) U.S. Cl.
CPC ................ G02B 1/04 (2013.01); C08K 5/0091 (2013.01); C08K 5/56 (2013.01); C08L 83/04 (2013.01); C08G 77/80 (2013.01); H01L 33/56 (2013.01)

(58) Field of Classification Search
CPC ........... G20B 1/04; C07F 7/1836; C07F 5/00; C07F 7/00; C07F 9/00
USPC ...................................... 528/39, 43
See application file for complete search history.

(56) References Cited

U.S. PATENT DOCUMENTS 6,207,728 B1 3/2001 Sekiguchi et al.
2010/0025724 A1 2/2010 Bae et al.

FOREIGN PATENT DOCUMENTS

| | | | |
|---|---|---|---|
| JP | 2006-299251 A | | 11/2006 |
| JP | 2010-085579 A | | 4/2010 |
| JP | 2010-144135 A | | 7/2010 |
| KR | 10-2008-0068246 A | | 7/2008 |
| WO | 2011 002826 | * | 1/2011 |
| WO | 2011002826 A1 | | 1/2011 |
| WO | 2012094450 A1 | | 7/2012 |

OTHER PUBLICATIONS

International Search Report issued in International Application No. PCT/KR2012/004819 on Dec. 14, 2012, 2 pages.
Supplementary European Search Report issued in corresponding European Application No. 12800978 dated Dec. 4, 2014, 7 pages.

* cited by examiner

Primary Examiner — Kuo-Liang Peng
(74) Attorney, Agent, or Firm — Rothwell, Figg, Ernst & Manbeck, P.C.

(57) ABSTRACT

The present application relates to a high-refractive composition. The composition of the present application exhibits excellent transparency, moisture resistance, heat resistance, water resistance, weather resistance, light resistance, and durability, and enables formation of a highly refractive film having a high index of refraction. The composition exhibits little outgassing during or after a process and can be applied to a solution application method, and thus can be effectively used in various electronic optical devices.

18 Claims, No Drawings

HIGH-REFRACTIVE COMPOSITION

CROSS REFERENCE TO RELATED APPLICATIONS

The present application is a continuation application of International Application PCT/KR2012/004819, with an international filing date of Jun. 18, 2012, which claims priority to and the benefit of Korean Patent Application No. 10-2011-0059097, filed Jun. 17, 2011, the disclosures of which are incorporated herein by reference in their entireties.

TECHNICAL FIELD

The present application relates to a high-refractive composition.

BACKGROUND ART

A high-refractivity resin may be used for an optical member required to have an antireflection effect, a light scattering effect or a light extraction effect. For example, the high-refractivity resin may be used for a plastic optical lens, a high-precision lens for optical disk recording, a prism, an optical fiber, an optical waveguide, an optical adhesive, an optical semiconductor packaging, or a functional material, such as an antireflection film, a light scattering film, a viewing angle improvement film; a luminance improvement film or an optical filter, which can be applied to a PDP (Plasma Display Panel) or an LCD (Liquid Crystal Display). Further, the high-refractivity resin may be used for an additive for plastic deterioration prevention, an additive for cosmetics, window glass for a vehicle, or the like.

As a method of manufacturing a high-refractivity resin, a method of introducing a sulfur-based resin (Patent Document 1), a method of using a halogen-introduced resin (Patent Document 2), and a method of using metal oxide (Patent Documents 3 to 5) are known.

However, according to the conventional methods, an implementable refractive index is limited, and a heat resistance, a weather resistance, etc. is decreased. Further, even after a curing process, an outgassing phenomenon continuously occurs under a high temperature condition, which causes a problem in manufacturing a device. Although a method of using metal oxide as a material capable of giving a high refractive index is known, if an amount of the metal oxide exceeds a certain level, it aggregates in a cured product, which causes light scattering and badly deteriorates transparency. Further, stable dispersion of the metal oxide particles cannot be maintained, and the particles tend to sink.

PRIOR ART DOCUMENT

Patent Document (Patent Document 1) Japanese Patent Laid-open Publication No. 2006-307200

(Patent Document 2) Japanese Patent Laid-open Publication No. 2001-011109

(Patent Document 3) Japanese Patent Laid-open Publication No. 2008-280202

(Patent Document 4) Japanese Patent Laid-open Publication No. 2007-084325

(Patent Document 5) Japanese Patent Laid-open Publication No. 2009-137774

DISCLOSURE

Technical Problem

The present application provides a composition having a high refractivity.

Technical Solution

An example of a composition having a high refractivity in the present application may include a silicon resin or its precursor, and an organic metal compound or its condensation product. The term "silicon resin" in the present specification may mean a compound including at least two siloxane units selected from siloxane units M, D, T, and Q in its framework.

In the present specification, the term "M unit" may mean a so-called monofunctional siloxane unit which can be generally represented by a chemical formula $(R_3SiO_{1/2})$. The term "D unit" may mean a so-called difunctional siloxane unit which can be generally represented by a chemical formula $(R_2SiO_{2/2})$. The term "T unit" may mean a so-called a trifunctional siloxane unit which can be generally represented by a chemical formula $(RSiO_{3/2})$. The term "Q unit" may mean a tetrafunctional siloxane unit which can be generally represented by a chemical formula $(SiO_{4/2})$. Herein, Rs are substituents directly bound to a silicon atom and independently represent, for example, hydrogen, a hydroxy group, an epoxy group, an acryl group, a methacryl group, an acryloyl group, a methacryloyl group, an isocyanate group, an alkoxy group or a monovalent hydrocarbon radical.

The term "composition having a high refractivity" may mean a composition having a refractive index of, for example, 1.50 or more, 1.55 or more, 1.60 or more, 1.65 or more, 1.7 or more, or 1.8 or more, or a composition having a refractive index in any of the above-described ranges after being cured. The refractive index is measured by a UV-VIS spectrometer with respect to light having a wavelength of 450 nm according to a method described below.

The composition includes a silicon resin or a precursor which can form the silicon resin together with an organic metal compound or its condensation product. In an exemplary embodiment, the composition is cured and implemented as a silicon hybrid film having a high refractive index. During a process, the composition does not cause phase separation and forms a high-refractivity film with excellent transparency. Further, the composition or the high-refractivity film have excellent properties including heat resistance, weather resistance, mechanical strength, and the like, and does not cause an outgassing phenomenon during or after the process. Furthermore, even if other materials are deposited or layered on the high-refractivity film as necessary, the high-refractivity film is not degenerated, and thus it is advantageous in manufacturing a device.

The composition includes a silicon resin or a precursor which can form the silicon resin. For example, the silicon resin may be represented by an average composition formula 1 of Chemical Formula 1.

$$(R_3SiO_{1/2})_a(R_2SiO_{2/2})_b(RSiO_{3/2})_c(SiO_{4/2})_d(XO_{1/2})_e \quad \text{Chemical Formula 1}$$

In Chemical Formula 1, Rs are substituents bound to a silicon atom and independently represent hydrogen, an alkyl group or an aryl group, X represents a hydrogen atom or an alkyl group, a+b+c+d+e is 1, and a is between 0 and 0.6, b is between 0 and 0.97, c is between 0 and 0.8, d is between 0 and 0.4 and e is 0 or a positive number. If the silicon resin is a crosslinking resin to be described later, c and d may not be 0 simultaneously in Chemical Formula 1.

In the present invention, the silicon resin can be represented by a certain average composition formula. Naturally, when the composition includes a single silicon resin, the silicon resin can be represented by the average composition formula, but also when the composition includes multiple silicon resins, an average composition of the multiple silicon resins can be represented by the average composition formula.

In Chemical Formula 1, Rs are substituents bound to a silicon atom and may be the same as or different from each other, and also independently represent hydrogen, an alkyl group or an aryl group. The alkyl group or the aryl group may be subject to substitution by one or more substituents, as necessary. The substituents which may substitute for the alkyl group or the aryl group may include halogen, a hydroxy group, an epoxy group, an acryl group, a methacryl group, an acryloyl group, a methacryloyl group, an isocyanate group, a thiol group, an alkoxy group or a monovalent hydrocarbon radical. In an exemplary embodiment, if the alkyl group or the aryl group includes one or more substituents, the substituent may not include a thermosettable or photo-curable substituent, for example, an epoxy group, a hydroxy group, an acryl group, a methacryl group, an acryloyl group, a methacryloyl group, an isocyanate group or an alkyl group.

The term "alkoxy group" may mean an alkoxy group having 1 to 20 carbon atoms, 1 to 16 carbon atoms, 1 to 12 carbon atoms, 1 to 8 carbon atoms or 1 to 4 carbon atoms, unless context dictates otherwise. The alkoxy group may be a linear, branched or cyclic alkoxy group and may be selectively subject to substitution by one or more substituents.

The term "monovalent hydrocarbon radical" may mean a monovalent residue derived from a compound comprised of carbon and hydrogen, or a compound comprised of carbon and hydrogen of which at least one hydrogen atom is subject to substitution by a certain substituent. The monovalent hydrocarbon radical may have, for example, 1 to 20 carbon atoms, 1 to 16 carbon atoms, 1 to 12 carbon atoms, 1 to 8 carbon atoms or 1 to 4 carbon atoms. The monovalent hydrocarbon radical may include, for example, an alkyl group, an alkenyl group or an aryl group.

The term "alkyl group" may mean an alkyl group having 1 to 20 carbon atoms, 1 to 16 carbon atoms, 1 to 12 carbon atoms, 1 to 8 carbon atoms or 1 to 4 carbon atoms, unless context dictates otherwise. The alkyl group may be a linear, branched or cyclic alkyl group and may be selectively subject to substitution by one or more substituents.

Further, the term "alkenyl group" may mean an alkenyl group having 2 to 20 carbon atoms, 2 to 16 carbon atoms, 2 to 12 carbon atoms, 2 to 8 carbon atoms or 2 to 4 carbon atoms, unless context dictates otherwise. The alkenyl group may be a linear, branched or cyclic alkenyl group and may be selectively subject to substitution by one or more substituents.

The term "aryl group" may mean a monovalent residue derived from a compound having a benzene ring or a bonding or condensed structure of two or more benzene rings or its derivative. The term "aryl group" may include not only a functional group typically called an aryl group, but also a so-called aralkyl group or arylalkyl group. The aryl group may be an aryl group having, for example, 6 to 25 carbon atoms or 6 to 21 carbon atoms, and may include a phenyl group, a dichlorophenyl, chlorophenyl, a phenylethyl group, a phenylpropyl group, a benzyl group, a tolyl group, a xylyl group or a naphthyl group. In an exemplary embodiment, the acryl group may be a phenyl group.

In Chemical Formula 1, at least one of Rs may be an aryl group, for example, a phenyl group. The silicon resin may contain the aryl group such that a molar ratio (Ar/Si) of the aryl group (Ar) to the total silicon atoms (Si) contained in the resin is more than 0.3, 0.5 or 0.7. If the molar ratio (Ar/Si) exceeds 0.3, a refractive index, an optical property, a moisture resistance, a weather resistance, and a hardness property can be maintained excellent. The upper limit of the molar ratio (Ar/Si) is not particularly limited and may be, for example, 2.0 or less, 1.5 or less or 1.2 or less.

In Chemical Formula 1, a, b, c, d, and e are molar fractions of respective units. If the sum total (a+b+c+d+e) is 1, a may be between 0 and 0.6 or between 0 and 0.5, b may be between 0 and 0.97 or between 0 and 0.8, c may be between 0 and 0.8 or between 0 and 0.7, d may be between 0 and 0.4 or between 0 and 0.2, and e may be 0 or a positive number. If e is a positive number, the silicon resin's function of stabilizing metal particles within the film may be improved.

The silicon resin may be, for example, a crosslinked silicon resin. The term "crosslinked silicon resin" may mean a resin that surely includes a T unit or a Q unit as a siloxane unit. For example, the crosslinked silicon resin may mean a T unit and a Q unit. Therefore, the c and d may not be 0 simultaneously.

The silicon resin may include one or more selected from the group consisting siloxane units represented by Chemical Formulas 2 and 3.

$(R^4R^5SiO_{2/2})$      Chemical Formula 2

$(R^6SiO_{3/2})$      Chemical Formula 3

In Chemical Formulas 2 and 3, $R^4$ and $R^5$ independently represent an alkyl group or an aryl group, and at least one of $R^4$ and $R^5$ is an aryl group and $R^6$ is an aryl group.

A siloxane unit of Chemical Formula 2 is a D unit containing an aryl group bound to at least one silicon atom. The siloxane of Chemical Formula 2 may be, for example, a siloxane unit of Chemical Formula 4 or 5.

$(C_6H_5)(CH_3)SiO_{2/2}$      Chemical Formula 4

$(C_6H_5)_2SiO_{2/2}$      Chemical Formula 5

Further, Chemical Formula 3 may represent a T unit containing an aryl group bound to a silicon atom, and may be, for example, a siloxane unit represented by Chemical Formula 6.

$(C_6H_5)SiO_{3/2}$      Chemical Formula 6

In the silicon resin, the aryl groups bound to all silicon atoms contained in the resin may be included in the siloxane unit of Chemical Formula 2 or 3. Further, in this case, a unit of Chemical Formula 2 may be a unit of Chemical Formula 4 or 5, and a unit of Chemical Formula 3 may be a unit of Chemical Formula 6.

The silicon resin may have a weight average molecular weight ($M_w$) in the range of 500 to 100,000 and desirably from 1,000 to 50,000. By controlling a molecular weight of the resin as described above, it is possible to maintain excellent workability and processability during each process using the composition, and also possible to maintain excellent hardness, light stability, and durability after a curing process. The weight average molecular weight is a standard polystyrene conversion value measured by means of gel permeation chromatography (GPC).

The composition may include a silicon resin or a silicon-based material as a precursor which can form the silicon resin. The term "precursor or silicon-based material" is a general term for all kinds of materials that can form the silicon resin, and may be, for example, an addition-curable composition, a condensation- or polycondensation-curable composition, an ultraviolet-curable composition, or a peroxide vulcanized composition. In an exemplary embodiment, the precursor may be, but is not limited to, an addition-curable composition, a condensation- or polycondensation-curable composition, or an ultraviolet-curable composition.

An addition-curable silicon composition can form a silicon resin through a hydrosilylation reaction. In the case of using the addition-curable silicon composition, an organic silicon compound containing a hydrogen atom bound to a silicon atom and an organic silicon compound containing alkenyl bound to a silicon atom are cured with a catalyst such as a platinum-based catalyst, and thus a silicon resin can be manufactured.

Further, a condensation- or polycondensation-curable composition contains organic silane or siloxane having a hydrolysable and/or condensable functional group such as —Cl, —OCH$_3$, —OC(O)CH$_3$, —O(CH$_3$)$_2$, —OHCOCH$_3$ or —OCH$_3$. The organic silane or the siloxane can be cured through a hydrolysis and/or condensation reaction, and thus a silicon resin can be manufactured.

Furthermore, an ultraviolet-curable composition may contain a silicon compound such as silane or siloxane having a functional group which can be polymerized by an ultraviolet light, for example, (meta)acryl or vinyl or its hydrolysate, which is used in a hydrolysis reaction and/or a condensation reaction, and thus a silicon resin can be manufactured. Ultraviolet light may be used to manufacture a silicon resin.

In the pertinent art, various materials, such as an addition-curable silicon material, a condensation- or polycondensation-curable silicon material, or an ultraviolet-curable silicon material, which can be selected depending on a structure or an average composition formula of a required silicon resin, and conditions or reaction additives for manufacturing a silicon resin by using such materials, have been publicly known. A silicon-based material can be formed by those skilled in the art by appropriately employing the above-described materials.

In an exemplary embodiment, the precursor may be a condensation-curable composition including a compound represented by Chemical Formula 7 or a compound represented by Chemical Formula 8, or including a compound represented by Chemical Formula 7 and a compound represented by Chemical Formula 8.

     Chemical Formula 7

     Chemical Formula 8

In Chemical Formula 7 or 8, $R^7$ is a substituent bound to a silicon atom and represents hydrogen, an alkyl group or an aryl group, and $R^8$ is a condensation-curable functional group.

In Chemical Formula 7 or 8, $R^8$ is not particularly limited as long as it can form a siloxane framework (—Si—O—Si—) through a condensation reaction, for example, a sol-gel condensation reaction. In an exemplary embodiment, $R^8$ may be halogen such as Cl, —OR$^9$, —OC(=O)R$^9$, —N(R$^9$)$_2$, —N(—C(=O)R$^9$)$_2$ or —SR$^9$. Herein, $R^9$ may independently represent, for example, hydrogen or an alkyl group, but is not limited thereto.

An organic metal compound or its condensation product contained in the composition may be, for example, a compound represented by Chemical Formula 9 or its condensation product.

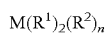     Chemical Formula 9

In Chemical Formula 9, M is any one of metal elements selected from the group consisting of metal elements in the Groups 3 to 5 and 12 to 15 in the periodic table, $R^1$ is an organic functional group bound to M, $R^2$ is a condensable functional group, and n is 0, 1 or 2.

In the compound represented by Chemical Formula 9, M represents a metal whose oxide has a refractive index of 1.6 or more, and may be any one of metal elements in the Groups 3 to 5 and 12 to 15 in the periodic table. The metal may be, for example, a metal in the Group 4 or 12 in the periodic table, or titanium, zirconium or zinc.

Further, in Chemical Formula 9, $R^1$ may be an organic residue bound to M. A bond between the organic residue and the metal may include a hydrogen bond, an ionic bond, a covalent bond or a coordinate bond, and may be, for example, a covalent bond or a coordinate bond. The organic residue may be, for example, alkoxy, alkyloxyalkoxy, beta-diketone, beta-diketonate or alkanolamine.

For example, an organic residue represented by Chemical Formula 10 may be used as $R^1$.

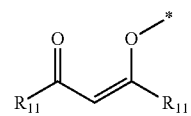

Chemical Formula 10

In Chemical Formula 10, * represents a bond between 0 and M, and $R_{11s}$ represent hydrogen, an alkyl group or —OR$^3$. Herein, $R^3$ is hydrogen or a monovalent hydrocarbon radical.

In Chemical Formula 10, an unshared electron pair of oxygen atoms included in a carbonyl group may form a coordinate bond with M of Chemical Formula M.

$R^2$ may be a residue represented by Chemical Formula 11.

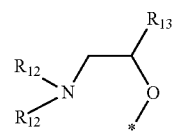

Chemical Formula 11

In Chemical Formula 11, * represents a bond between O and M, $R_{12s}$ represent hydrogen, an alkyl group or an aryl group, at least one of the $R_{12}$s may be hydrogen or an alkyl group, and $R_{13}$ represents hydrogen or an alkyl group.

In the residue represented by Chemical Formula 11, at least one of the $R_{12}$s may be, for example, a 2-hydroxyethyl group or a 2-hydroxypropyl group, and each $R_{12}$ can form covalent or coordinate bonds with the same atoms, or can form covalent or coordinate bonds with different atoms.

In the organic metal compound represented by Chemical Formula 9, $R^2$ represents a condensable functional group and n represents 0, 1 or 2. The condensable functional group may include a functional group which can induce a condensation reaction and a precursor which can be converted into a condensable functional group through a hydrolysis reaction or the like. In the organic metal compound, $R^2$ may form a condensation product of the compound through a hydrolysis reaction and/or a condensation reaction.

A kind of $R^2$ is not particularly limited and may be, for example, a hydroxy group or an alkoxy group. In the compound represented by Chemical Formula 9, $R^1$ may be, for example, an alkoxy group, the residue represented by Chemical Formula 10 or the residue represented by Chemical Formula 11. In another exemplary embodiment, $R^1$ may be an alkoxy group or the residue represented by Chemical Formula 10.

The organic metal compound represented by Chemical Formula 9 can be synthesized by various synthesis methods publicly known in the art.

The organic metal compound represented by Chemical Formula 9 may be contained in the composition, or a condensation product thereof may be contained in the composition, as necessary.

The condensation product of the organic metal compound can be represented by, for example, Chemical Formula 12.

Chemical Formula 12

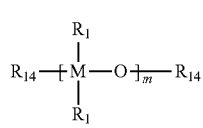

In Chemical Formula 12, M is any one of metal elements in the Group 3 to 5 and 12 to 15 in the periodic table, $R_1$ is the organic functional group bound to M as defined in Chemical Formula 9, m represents a number of 2 or more, or between 3 and 10, and $R_{14}$ represents hydrogen, an alkoxy group or a monovalent hydrocarbon radical.

$R_{14}$ may be, for example, an alkoxy group or an alkyl group, and may be, for example, an alkoxy group having 1 to 8 carbon atoms or an alkyl group having 1 to 8 carbon atoms.

The compound represented by Chemical Formula 12 can be prepared through various hydrolysis reactions and/or condensation reactions publicly known in the art by using $R^1$ or $R^2$ of the compound represented by Chemical Formula 9.

The condensation product of the compound represented by Chemical Formula 9, such as the compound represented by Chemical Formula 12, may have a molecular weight or a weight average molecular weight of 1,000 or less. In this range, the condensation product can be dispersed at high concentration in the composition and can form a composition having excellent transparency and a high refractivity or a cured product thereof.

The composition may include the organic metal compound represented by Chemical Formula 9 or its condensation product in the amount of from 10 parts by weight to 800 parts by weight, relative to 100 parts by weight of the silicon resin or its precursor. In this range, a composition having excellent transparency and a high refractivity or a cured product thereof can be provided.

In the present specification, the units "parts by weight" represent weight ratios of respective components.

The composition may further include a solvent, and thus it is possible to improve workability and processability of the composition. A kind of a solvent is not particularly limited and may include, for example, an alcohol-based solvent, a glycol-based and ether-based solvent, an ester-based solvent, an aromatic solvent, a ketone-based solvent, an ether-based solvent, or a mixed solvent including two or more solvents. The amount of the solvent is not particularly limited and can be selected appropriately in consideration of workability.

Further, the composition may further include a certain additive such as a dye, a surfactant or a chelate, depending on an applied use.

The present application relates to an electronic optical device including a substrate, and a cured product of the composition formed on the substrate.

The composition can form a cured product having excellent transparency and a high refractivity, and has excellent heat resistance, light resistance, moisture resistance, and weather resistance. During a curing process or after a curing process, an outgassing phenomenon does not occur. Further, during a deposition process, a film has excellent stability and is less prone to an outgassing phenomenon, enabling it be applied to an optical emission site or a photo-sensing site of various electronic optical devices and thereby improve the performance of those devices.

The substrate may be a flat-screen display, an optical sensor, a photonic chip or a photonic circuit, a light emitting diode (LED), an organic light emitting diode (OLED) or a light emission or photo-sensing site. Besides, the substrate may be a site for optical emission or light sensing in various electronic optical devices requiring a film having a high refractivity and excellent transparency.

The present application relates to an electronic optical device manufacturing method comprising: coating the composition on the substrate by using a solution coating method; and curing the coated composition.

In the composition, the organic metal compound or its condensation product can be dispersed at high concentration and deterioration of transparency caused by agglomeration thereof does not occur. Therefore, the composition can be used to manufacture an electronic optical device by using the solution coating method. Accordingly, the composition can be used effectively when a large-area electronic optical device is manufactured.

The above-described manufacturing method includes a step of coating the composition on a substrate by using the solution coating method, and this step may be carried out by, for example, dip coating, draw-down coating, spin coating, spray coating or bar coating. In this case, a kind of the substrate on which the composition is coated has been described above.

The above-described manufacturing method includes a step of curing the composition coated under an appropriate condition after the step of coating. In this case, a method of curing the composition is not particularly limited and, for example, heating, ultraviolet irradiation or vulcanization may be used, depending on a kind of a material.

The step of curing in the manufacturing method may be performed after the composition is treated at an appropriate temperature and the solvent contained in the composition is removed, as necessary.

Effects of the Invention

The composition of the present application exhibits excellent transparency, moisture resistance, heat resistance, water resistance, weather resistance, light resistance, and durability, and enables formation of a highly refractive film having a high index of refraction. The composition exhibits little outgassing during or after a process and can be applied to a solution application method, and thus can be effectively used in various electronic optical devices.

BEST MODE

Hereinafter, the composition will be explained in detail with reference to examples and comparative examples, but a scope of the composition is not limited to the following examples.

In the present example, a light transmittance, a refractive index, and an outgas sing level were evaluated by the following methods.

1. Measurement of Light Transmittance

A curable composition prepared in Examples and Comparative Examples was coated on a glass substrate and cured so as to form a film having a thickness of 1 μm. The film was examined with the naked eyes and a light transmittance thereof was measured based on the following criteria.

<Light Transmittance Evaluation Criteria>

O: A case where a haze was not observed with the naked eyes

X: A case where a haze was observed with the naked eyes

2. Measurement of Refractive Index

A curable composition prepared in Examples and Comparative Examples was coated on a substrate and cured so as to form a film having a thickness of 1 μm. A refractive index of the film was measured at normal temperature by a UV-VIS spectrometer with respect to light having a wavelength of 450 nm.

3. Measurement of Outgassing Level

A curable composition prepared in Examples and Comparative Examples was coated on a substrate and cured so as to form a film having a thickness of 1 μm. Then, only the cured layer was extracted and a change in mass before and after the cured layer was left at a temperature of 200° C. for 6 hours was measured by using a thermoanalyzer so as to evaluate an outgassing property.

Example 1

300 mmol of methyltrimethoxysilane and 300 mmol of tetramethoxysilane were sol-gel polymerized in the presence of an acid catalyst so as to prepare a silicon resin. Then, 2 g of the prepared resin and 8 g of poly(dibutyltitanate) (polymerization degree: n=4) were dissolved in 10 g of ethyleneglycoldiethylether so as to prepare a curable composition. Thereafter, the composition was spin coated and cured at a temperature of 200° C. for 30 minutes so as to form a high-refractivity film.

Example 2

A high-refractivity film was prepared in the same manner as described in Example 1 except that 8 g of titanium di-n-butoxide(bis-2,4-pentanedionate) was used instead of poly(dibutyltitanate).

Example 3

A high-refractivity film was prepared in the same manner as described in Example 1 except that 8 g of zirconium t-butoxide was used instead of poly(dibutyltitanate).

Example 4

300 mmol of phenyltrimethoxysilane and 300 mmol of tetramethoxysilane were sol-gel polymerized in the presence of an acid catalyst so as to prepare a silicon resin. Then, 2 g of the prepared resin and 8 g of poly(dibutyltitanate) as used in Example 1 were dissolved in 10 g of ethyleneglycoldiethylether so as to prepare a curable composition. Thereafter, the composition was spin coated and cured at a temperature of 200° C. for 30 minutes so as to form a high-refractivity film.

Comparative Example 1

300 mmol of methyltrimethoxysilane and 300 mmol of tetramethoxysilane were sol-gel polymerized in the presence of an acid catalyst so as to prepare a silicon resin. Then, 2 g of the prepared resin was dissolved in 10 g of ethyleneglycoldiethylether so as to prepare a curable composition. Thereafter, the composition was coated and cured at a temperature of 200° C. for 30 minutes so as to form a film.

Comparative Example 2

A cured film was prepared in the same manner as described in Example 1 except that 5 g of a titanium dioxide dispersion solution (solid concentration: 35 weight %, average particle diatmere: 10 nm) was used instead of poly(dibutyltitanate).

Comparative Example 3

A cured film was prepared in the same manner as described in Example 1 except that 8 g of a zirconium oxide dispersion solution (solid concentration: 25 weight %, average particle diatmere: 20 nm) was used instead of poly(dibutyltitanate).

The results of measuring the properties of the films prepared in the Examples and Comparative Examples are listed in Table 1.

TABLE 1

|  | Example | | | | Comparative Example | | |
| --- | --- | --- | --- | --- | --- | --- | --- |
|  | 1 | 2 | 3 | 4 | 1 | 2 | 3 |
| Light transmittance | O | O | O | O | O | X | X |
| Refractive index | 1.96 | 1.91 | 1.82 | 2.05 | 1.43 | — | — |
| Mass reduction rate (Outgassing level) | 0.18 | 0.19 | 0.21 | 0.20 | 0.15 | 0.13 | 0.13 |

As can be seen from the results listed in Table 1, the compositions according to the present application have excellent transparency and enable formation of a cured film having a high refractive index. In this regard, when metal oxide particles were used, it was impossible to form a cured film having both transparency and a high refractive index. In Comparative Examples 2 and 3, a very heavy haze occurred on the films and light was badly scattered, and thus it was impossible to measure the refractive index. Further, it can be seen that in all of the compositions according to the present application, a mass reduction rate used for evaluation of an outgassing level was as low as 0.3% or less.

The invention claimed is:

1. A high-refractive composition, comprising:
   a silicone resin having an average composition formula of Chemical Formula 1 or a precursor thereof; and
   a compound represented by Chemical Formula 12:

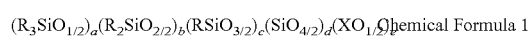

$(R_3SiO_{1/2})_a(R_2SiO_{2/2})_b(RSiO_{3/2})_c(SiO_{4/2})_d(XO_{1/2})_e$ Chemical Formula 1

Chemical Formula 12

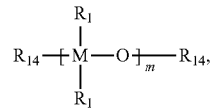

$$R_{14}\!-\!\!\left(\!M\!\begin{array}{c}R_1\\|\\|\\R_1\end{array}\!\!-\!\!O\right)_{\!\!m}\!\!-\!\!R_{14},$$

wherein, R's are substituents bound to a silicon atom and independently represent hydrogen, an alkyl group or an aryl group; X represents a hydrogen atom or an alkyl group; the sum (a+b+c+d+e) of a, b, c, d and e is 1, a is between 0 and 0.6, b is between 0 and 0.97, c is between 0 and 0.8, d is between 0 and 0.4, e is 0 or a positive number, M is any one of metal elements in Group 3 to 5 and 12 to 15 in the periodic table, $R_1$ is an organic functional group bound to M, m represents a number of 2 or more, and $R_{14}$ represents hydrogen, an alkoxy group or a monovalent hydrocarbon radical.

2. The high-refractive composition of claim 1, wherein a refractive index before or after curing is 1.50 or more.

3. The high-refractive composition of claim 1, wherein the silicon resin is a crosslinked silicone resin.

4. The high-refractive composition of claim 1, wherein the silicone resin comprises an aryl group.

5. The high-refractive composition of claim 1, wherein the silicone resin comprises a siloxane unit represented by Chemical Formula 3 or 4:

($R^4R^5SiO_{2/2}$)  Chemical Formula 3

($R^6SiO_{3/2}$),  Chemical Formula 4 wherein, $R^4$ and $R^5$ independently represent an alkyl group or an aryl group, with the proviso that at least one of $R^4$ and $R^5$ is an aryl group; and $R^6$ is an aryl group.

6. The high-refractive composition of claim 1, wherein the silicone resin has a weight average molecular weight in the range from 500 to 100,000.

7. The high-refractive composition of claim 1, wherein the precursor is a condensation- or polycondensation-curable composition.

8. The high-refractive composition of claim 1, wherein the precursor comprises a compound represented by Chemical Formula 8 or a compound represented by Chemical Formula 9:

Si($R^7$)($R^8$)$_3$  Chemical Formula 8

Si($R^8$)$_4$  Chemical Formula 9 wherein $R^7$ is a substituent bound to a silicon atom and represents hydrogen, an alkyl group or an aryl group, and $R^8$ is a condensation-curable functional group.

9. The high-refractive composition of claim 1, wherein M is metal in Group 4 or 12 in the periodic table.

10. The high-refractive composition of claim 1, wherein $R^1$ is alkoxy, alkyloxyalkoxy, beta-diketone, beta-diketonate or alkanolamine.

11. The high-refractive composition of claim 1, wherein $R^1$ is represented by Chemical Formula 10:

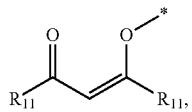

Chemical Formula 10 wherein, the mark "*" means that the O is bound to the M, the $R_{11}$'s represent hydrogen, an alkyl group or —$OR^3$, where $R^3$ is hydrogen or a monovalent hydrocarbon radical.

12. The high-refractive composition of claim 1, wherein $R^1$ is represented by Chemical Formula 11:

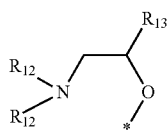

Chemical Formula 11 wherein, the mark "*" means that the O is bound to the M, the $R_{12}$'s represent hydrogen, an alkyl group or an aryl group, with the proviso that at least one of the $R_{12}$'s is hydrogen or an alkyl group; and $R_{13}$ represents hydrogen or an alkyl group.

13. The high-refractive composition of claim 1, wherein the compound represented by Chemical Formula 12 has a molecular weight or a weight average molecular weight of 1,000 or less.

14. The high-refractive composition of claim 1, wherein the organic metal compound or the condensation product thereof is comprised in the amount of 10 parts by weight to 800 parts by weight, relative to 100 parts by weight of the silicone resin or the precursor thereof.

15. The high-refractive composition of claim 1, further comprising a solvent.

16. An electronic optical device comprising:
a substrate; and
a cured product of the composition of claim 1 formed on the substrate.

17. The electronic optical device of claim 16, wherein the substrate is a flat-screen display, an optical sensor, a photonic chip, a photonic circuit, a light emitting diode, an organic light emitting diode or a light emission or photo-sensing site.

18. A method of manufacturing an electronic optical device, comprising: coating the composition of claim 1 on a substrate by a solution coating method; and curing the composition.

* * * * *